United States Patent [19]
Dalal et al.

[11] Patent Number: 5,976,970
[45] Date of Patent: Nov. 2, 1999

[54] METHOD OF MAKING AND LATERALLY FILLING KEY HOLE STRUCTURE FOR ULTRA FINE PITCH CONDUCTOR LINES

[75] Inventors: Hormazdyar Minocher Dalal, Milton; Hazara Singh Rathore, Stormville, both of N.Y.

[73] Assignee: International Business Machines Corporation, Armonk, N.Y.

[21] Appl. No.: 08/626,764

[22] Filed: Mar. 29, 1996

[51] Int. Cl.$^6$ .................................................. H01L 21/283
[52] U.S. Cl. .......................... 438/637; 438/655; 438/660; 438/661; 438/672; 438/675; 438/FOR 357; 438/FOR 358
[58] Field of Search ..................... 438/655, 660, 438/661, 672, 675, 637, FOR 357, FOR 358

[56] References Cited

U.S. PATENT DOCUMENTS

| | | | |
|---|---|---|---|
| 3,837,907 | 9/1974 | Berglund et al. | 117/212 |
| 5,252,516 | 10/1993 | Nguyen et al. | 437/195 |
| 5,262,354 | 11/1993 | Cote et al. | 437/195 |
| 5,354,712 | 10/1994 | Ho et al. | 437/195 |
| 5,362,677 | 11/1994 | Sakamoto et al. | 437/203 |
| 5,610,103 | 3/1997 | Xu et al. | 437/225 |
| 5,654,232 | 8/1997 | Gardner | 438/661 |

FOREIGN PATENT DOCUMENTS 7058199  3/1995  Japan .

OTHER PUBLICATIONS

W. M. Moreau, "Semiconductor Lithography—Principles, Practices, and Materials" MICRODEVICES, Physics and Fabrication Technologies, 1988, pp. 631–673.

JAPIO AN 95–058199 of JP 07–058–199.

WPIDS AN 95–134 781 of JP 07–058–199.

*Primary Examiner*—Bennett Celsa
*Attorney, Agent, or Firm*—H. Daniel Schnurmann

[57] ABSTRACT

A method of forming electrical conductors having sub-half-micron geometries and using a high yield process is described. Trenches provided with an overhang are positioned where a metal interconnection is to be formed. A composite insulator layer is deposited and is followed by laterally filling with metal the trench under the overhang. Excess metal is then chem-mech polished. Only the non-crucial neck of the metal wiring is left exposed during polishing. Since spacing between the exposed metal lines is increased, it requires longer distances for the metal to smear and cause unwanted shorts. Three methods are described to laterally fill the trenches under the overhang. A first method describes the process parameters to achieve lateral deposition by high surface mobility and low sticking coefficient. A second method teaches a technique of inducing micro-creep to laterally fill the trenches under the overhang. A third method shows metal layered structures where volume expansion takes place upon phase transformation.

11 Claims, 7 Drawing Sheets

METHOD OF MAKING AND LATERALLY FILLING KEY HOLE STRUCTURE FOR ULTRA FINE PITCH CONDUCTOR LINES

FIELD OF THE INVENTION

The present invention relates generally to semiconductor integrated circuit devices and, more particularly, to a process of fabricating high yield sub-half-micron interconnections.

BACKGROUND OF THE INVENTION

Semiconductor devices within an integrated circuit chip (IC) are commonly interconnected by conductive lines, preferably made of Al, Cu and the like, their alloys or by layered metallurgy. With the increased density of the ICs, the dimensions of the interconnections have been sharply reduced. Process failures in the form of open and short-circuits have, correspondingly, become more prevalent. These problems are compounded to problems associated with high current density and electromigration, all of which have contributed in creating serious reliability concerns.

Interconnection wiring in ICs is generally fabricated using a subtractive etch method, e.g., Reactive-Ion-Etching (RIE). There are two serious drawbacks to this method, firstly, its inapplicability to copper metallurgy and, secondly, line short/open problems in an Al based metallurgy caused by the presence of a variety of defects and grain boundary attack by the etchant. Line shorts dramatically increase with decreasing pitch, limiting the pitch to approximately $0.7\mu m$. (microns) for any large scale manufacturability. Another shortcoming of the reactive ion etching relates to the high process yield loss due to conductor line opens, especially for line widths below $0.5\mu m$. Yet another shortcoming of the subtractive etch process resides in the difficulty in filling the gap between the metal lines, which in turn, raises additional reliability concerns.

The additive process that defines a fine wiring line has so far been limited to lift-off, a process well known to practitioners in the art. This process has an even wider limitation on the line width, and evidence of its use is limited to $1.0\mu m$. Another additive method, termed the 'Damascene' method, has been a subject of many innovations, but has not yet gained much acceptance in manufacturing lines. Crippling factors include corrosion, metal smearing and metal impregnation into the insulator during chem-mech polishing operation. These factors have created yield problems as evidenced by the presence of, for instance, shorts between adjacent conductor lines.

An effective method of containing the problem of metal shorts in a damascene process is described in U.S. Pat. No. 5,426,330 to Joshi et al., and of common assignee. Joshi et al. teach how to effectively cap soft metal with hard metal, e.g., tungsten, to prevent smearing of soft metal during chem-mech polishing.

One of the main drawbacks of hard metal cap damascene process lies in a reduction occurring to the cross-sectional area of the high conductivity metal, causing an increase in the resistance per unit area of the conductor. A second problem is the continuous presence of deposited soft metal alongside the top edge of the trench which is exposed during the final stages of metal polishing, and which lends itself to the same perils as those described above, viz., metal smearing and resulting shorts.

The metal film discontinuity at the top edge of trenches may be achieved by evaporation techniques similar to those used for depositing soft metal. However, evaporation gives a poor trench fill in fine geometries, and hence cannot be readily extended to line widths below approximately 1 $\mu m$.

Another technique that describes how to make deposited metal discontinuous at the top perimeter of a trench is disclosed in U.S. Pat. No. 3,837,907 to Berglund et al., who describe an overhang structure in a composite insulator which is constructed for the purpose of making the deposited metal discontinuous. Berglund et al. do not polish off the metal deposited on top of the insulator, but they let the conducting lines follow a parallel path to the metal deposited inside the groove. This scheme can only be used for redundant parallel lines of conductors, also the metal lines atop the insulator cannot be used for making contact to devices or vias or (via) studs below this level. Additionally, metal lines formed within the groove of such an overhang structure leaves voids along the sides and under the overhang, as illustrated in the drawings of Berglund's et al. of the aforementioned patent. In a damascene process, these voids may entrap chemicals, resulting in severe corrosion problems.

Grooves with an overhang cannot be filled by conformal coating methods, such as Chemical Vapor Deposition (CVD), because the narrow opening at the top gets laterally closed before a groove underneath is filled, thereby leaving big voids. Furthermore, no practical CVD method exists for aluminum metallurgy, and CVD of copper utilizes highly unstable precursors, barring its application in a manufacturing environment.

Recently, attention has been focused in obtaining good sidewall coverage in narrow grooves totally devoid of any overhang. One such methods is disclosed in U.S. Pat. No. 4,824,544 to Rossnagel, and of common assignee, who describes a collimated sputtering method to improve the directionality of the depositing metal atoms.

U.S. Pat. No. 5,403,779 to Joshi et al., and of common assignee, teaches a low pressure sputter deposition technique, with or without collimation, to achieve side wall coverage in narrow openings without overhang.

The aforementioned methods of Rossnagel et al. and Joshi et al. considerably improve the sidewall coverage of high aspect-ratio grooves, because the metal build-up on the top ledge of a groove (as in CVD) is curtailed by the nearly vertical direction of the depositing atoms. Not surprisingly, these methods are not applicable where lateral filling in an overhanged groove is required.

In summary, problems of leakage, short-circuits, corrosion, and the like, remain with traditional damascene methods, preventing their application to manufacturing processes.

OBJECTS OF THE INVENTION

Accordingly, it is an object of the present invention to provide an additive technique to form interconnect wiring of sub-half-micron dimensions on semiconductor substrates.

It is another object of the present invention to provide unique interconnection wiring formed by laterally filling key hole structured grooves to reduce the area of the soft metal exposed to chem-mech polishing.

It is yet another object of the present invention to increase the spacing between the metal lines exposed to chem-mech polishing without affecting the spacing or the pitch of the conductor lines.

It is still another object of the present invention to reduce metal defects, such as shorts between adjacent conductor lines, as well as metal gauging caused by metal smearing and impregnation into the insulation during chem-mech polishing.

It is a more particular object of the present invention to provide metal deposition techniques to laterally deposit metal in a groove under an overhang.

SUMMARY OF THE INVENTION

According to one aspect of the present invention, a method is provided to form electrical conductors applicable to sub-half-micron geometries and which have a high process yield. More specifically, grooves with an overhang, corresponding to the desired metal interconnection pattern, are formed into a composite insulator followed by laterally filling the grooves under the overhang with the metal of choice, wherein excess metal is chem-mech polished. Only the non-crucial neck of the metal wiring is exposed during polishing. Additionally, the spacing between the exposed metal lines is increased, thereby requiring longer distances for metal to smear and cause unwanted shorts.

According to another aspect of the present invention, there is provided in a semiconductor integrated circuit chip, a method of providing interconnections between devices contacting planarized studs, wherein the devices and the studs have been previously formed, the method comprising the steps of: depositing a first insulator layer on the planarized studs, the layer having a thickness essentially equal to the thickness of the interconnection to be formed; depositing a layer of a second insulator on the first insulator layer; selectively reactive-ion-etching a slit in the second insulator layer at a position wherein the interconnection is to be formed; reactive-ion-etching the first insulator layer through the slit until the contact stud is exposed, forming a key hole structured trench having a width that is wider than the slit; chemically etching the key hole structured trench to form vertical and recessed walls in the first insulator layer; depositing metal through the slit to laterally fill the groove under the overhang; and removing an excess of the metal lying over the second insulator layer.

BRIEF DESCRIPTION OF THE DRAWINGS

The foregoing and other objects, aspects and advantages will be better understood from the following detailed description of a preferred embodiment of the invention with reference to the drawings, in which.

PREFERRED DESCRIPTION OF THE PREFERRED EMBODIMENTS

Figure 1A:
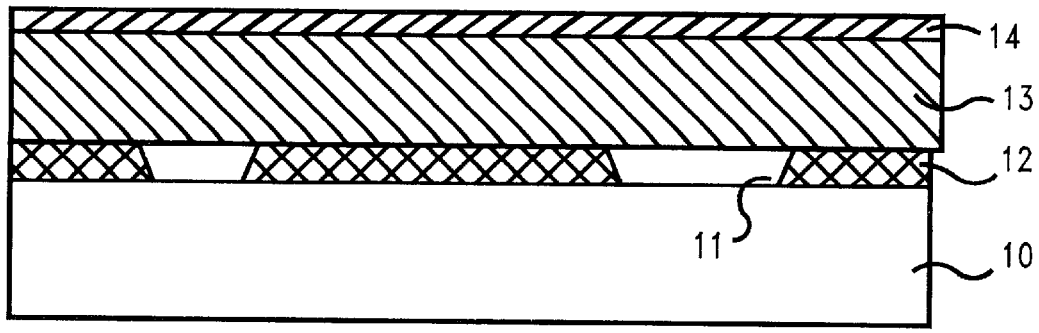
FIGS. 1a–1d are schematic diagrams of progressive process steps in defining a groove pattern corresponding to the desired metal interconnection pattern that is provided with an overhang, according to the present invention.

Referring now to the drawings, and more particularly to FIG. 1a, there is shown a semiconductor IC at a step subsequent to the completion of the front end of the process in which FET, CMOS, BiFET (BiCMOS) or Bipolar devices forming the integrated circuit are formed in a silicon substrate 10. Also contained in substrate 10 are device contacts and local interconnects. The method of this invention begins after the via-studs 11, making contacts to the local interconnects (not shown) in layer 10, and the passivation layer 12 have been co-planarized by previous processing steps.

In accordance with a first preferred embodiment of the present invention, in order to define the next level of interconnection lines on co-planarized surface and making contacts to via studs 11, a dielectric layer 13, e.g., silicon dioxide or polyimide, having a thickness adequate for containing interconnection metal wires, typically, from 0.3–0.5 $\mu$m., is deposited on top of the insulated substrate, using one of the deposition techniques known in the art. A second layer 14 of insulating material, e.g., silicon nitride, magnesium oxide, aluminum oxide, silicon dioxide (if layer 12 is polyimide), is deposited atop layer 13. The thickness of the layer 14 ranges from 0.02 to 0.08 $\mu$m. The choice of layers 13 and 14 is made in pairs to allow for differential etching, e.g., layer 13 is $SiO_2$ and layer 14 is MgO or $Al_2O_3$.

Figure 1B:
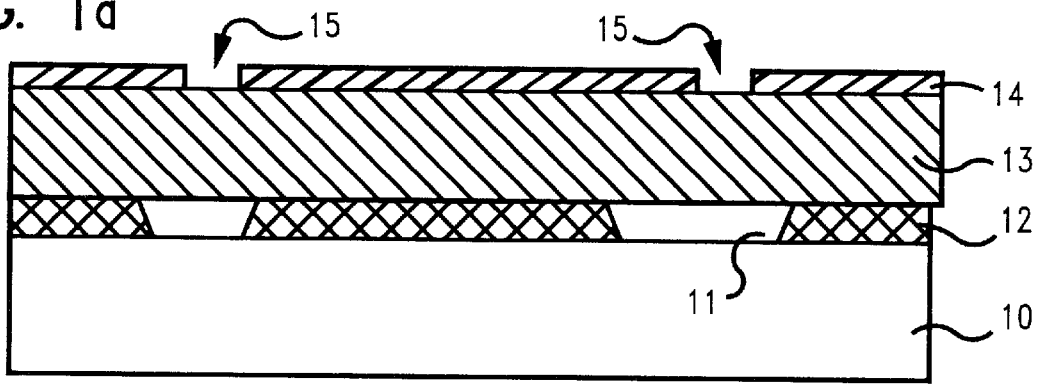
Figure 1C:
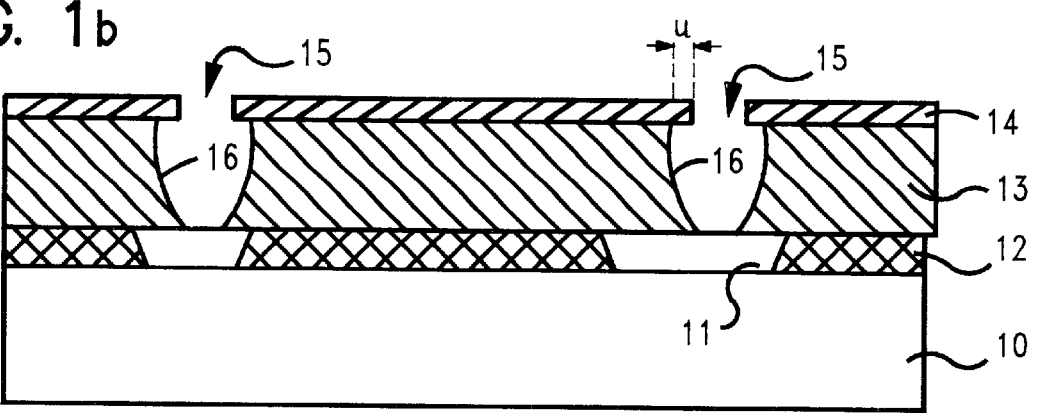
Figure 1D:
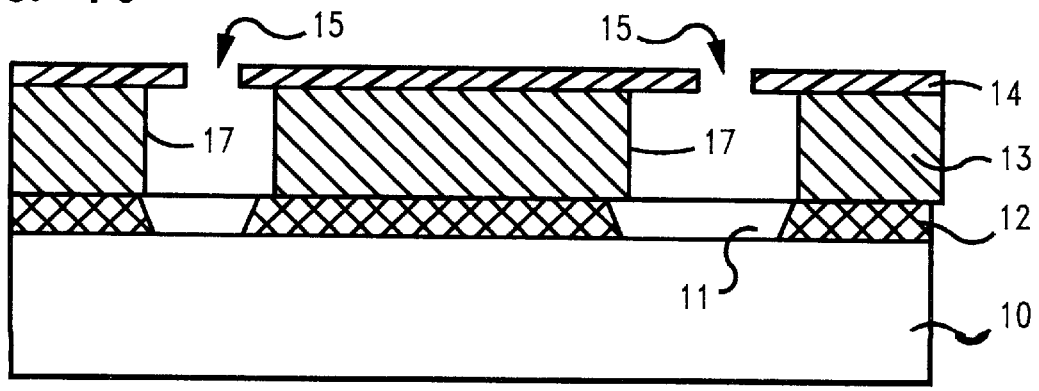

Using photo-lithographic techniques, channels having a width ranging from 0.08 $\mu$m. to 0.1 $\mu$m., typically, one-third the desired width of the interconnect line, are defined in thin (0.2 to 0.8 $\mu$m.) photoresist (not shown). Thin photoresist is instrumental in increasing the resolution of the resist system. The exposed dielectric layer 14 is then reactively ion-etched to open slits 15, as shown in FIG. 1b. The reactive gas is then changed to selectively etch the underlying insulator 13 to open grooves 16 (FIG. 1c). To reactive-ion-etch layer 13, an appropriate reactive gas intermixed with an inert carrier gas are used at a high pressure of 35 to 100 $\mu$m. and at a low power of 0.1 to 0.5 watt/sq.in. The high pressure reactive-ion-etching is advantageously used to increase lateral etching, as shown in FIG. 1c. Conditions of power, gas pressure and carrier gas to reactive gas ratio are adjusted to yield an undercut (shown as 'u' in FIG. 1c), which is typically one-third the width of the metal line, at each edge of the slit opening 15. The remaining overlay resist, if any, is removed by oxygen ashing. Next, the wafer is chemically etched in a highly diluted and hot BHF (Buffered Hydro Fluoric) acid, preferably at 60° C., typically, having a ratio ranging from 40:1 to 200:1 of ammonium fluoride to hydrofluoric acid. Diluted and hot BHF are used to increase lateral etching and, preferably, higher etching of sharp edges at the bottom of the grooves 16 (FIG. 1c), thereby resulting in an improved straight groove edge 17 (FIG. 1d). The undercut 'u' in FIG. 1d is approximately one-third the width of the desired interconnection line width. Thus, a key hole type structure comprised of narrow channels 17 provided with an overhang 15 is formed in the desired interconnection line pattern.

Figure 2A:
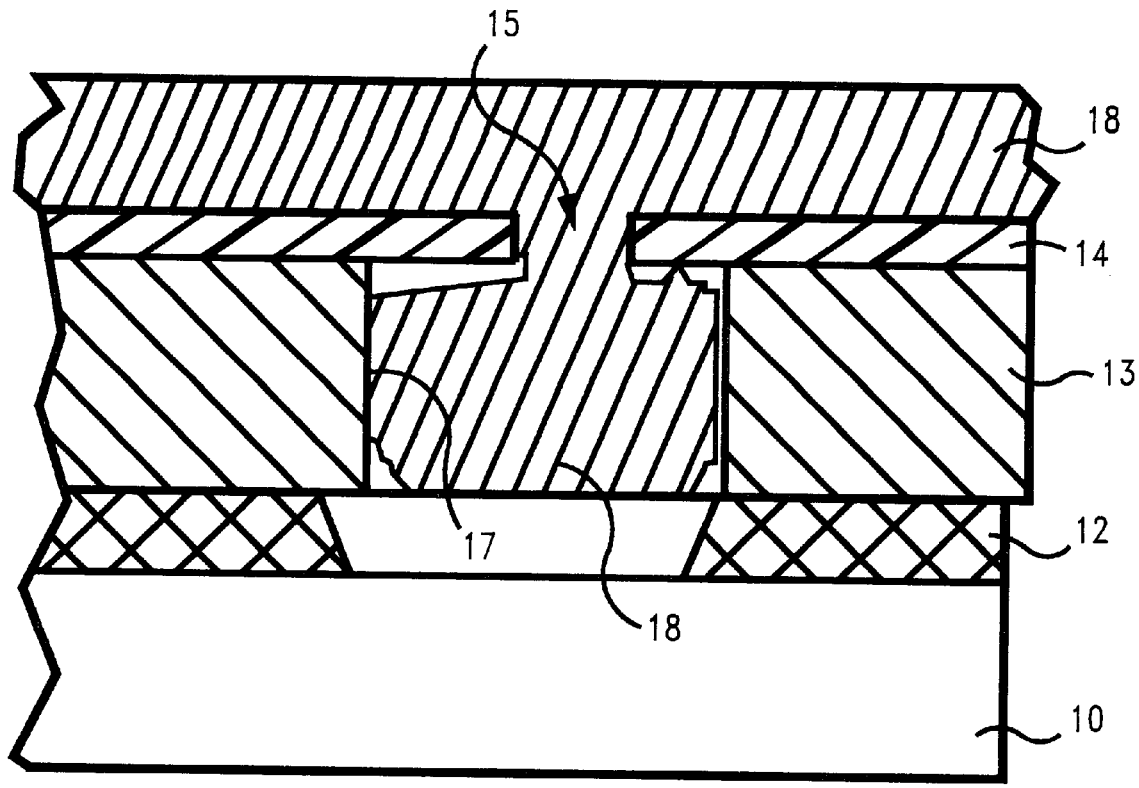
FIGS. 2a–2b are schematic diagrams of laterally filling the overhanged groove with metal and subsequently removing the excess metal to define a buried interconnection pattern, in accordance with the present invention.
Figure 2B:
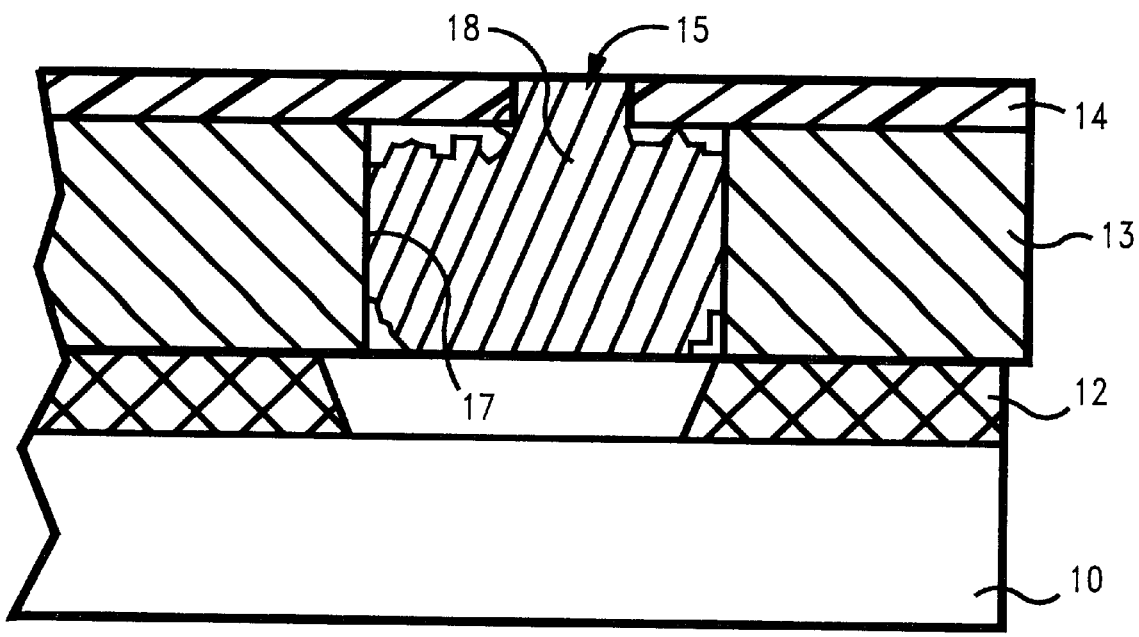

Referring now to FIG. 2a, a thin layer (not shown), typically, 0.01 to 0.03 $\mu$m. thick, of Ti, TiN, TaN or CVD W, is optionally deposited, using any of the methods known in the art. A high conductivity metal layer 18 (FIG. 2a) is deposited next to laterally fill groove 17 under the overhang 15. This is achieved by one of the methods that shall be described hereinafter. Excess metal layer 18 on top of the passivation layer 14 (FIG. 2a) is then removed by chemical-mechanical polish, using for that purpose methods and tools known in the art, and leaving portions of metal (FIG. 2b) of the high conductivity metal layer 18 in keyhole structured trenches.

Three separate embodiments for depositing layer 18 which laterally fills the groove 16 under the overhang 14 will now be described.

In a first embodiment of the present invention, high conductivity metal such as Al, Cu or their alloys, is sputter deposited under a certain combination of process parameters to laterally fill the grooves positioned under the overhang. This is preferably achieved by sputtering at a very low pressure, typically, less than 1 milli-Torr, using a gas mixture, preferably in the ratio of 80% Argon to 20% Helium, and at a relatively high substrate temperature, typically, 400° C. to 450° C. Particular care is exercised to ensure that no trace of reactive gas remains in the sputtering chamber during metal deposition. To remove the last traces of reactive gases, after initially pumping the system to below a pressure of $10^{-8}$ Torr, the wafers are heated to degas the chamber and the wafer surfaces. The metal target-is sputtered at half the power used for deposition to reactively remove residual gaseous impurities. The system is then reactively pumped, with a Ti getter pump or with an ion pump, to a total base pressure below $10^{-9}$ Torr, wafers are then sputter etch cleaned which also aids in further ionizing any residual reactive gases and resulting in a final pressure around $10^{-10}$ Torr.

Lateral spreading occurs as a result of high surface mobility, high directionality of depositing atoms prior to arriving at the wafer surface, and scattering of atoms within the confines of the overhanged groove brought about by the above specified process parameters. The scattering is achieved by a low sticking coefficient of the depositing atoms on the surfaces causing atom bouncing within the geometric constraints of a groove with an overhang structure. The low sticking coefficient is the result of the relatively high substrate temperature of 450° C. to 500° C. and of the scrupulously clean depositing environment devoid of any reactive residual gases. Helium in the sputtering gas also helps in reducing the sticking coefficient. Helium in the sputtering gas primarily helps achieve a low deposition rate and reduce gaseous scattering of depositing atoms prior to reaching the wafer surface, thereby enabling atoms to go through the slit without appreciable metal build-upon the edges of the slit. The use of a low sputtering gas pressure improves the directionality of the depositing atoms prior to reaching the wafer surface, thereby allowing the atoms to traverse the slit without running the risk of appreciable metal build-up.

FIGS. 3a–3d illustrate the mechanism of delayed nucleation of a metal film on the insulator and, at the same time, enhanced metal film nucleation within the groove, brought about by the nearly vertical atom impingement on the wafer surface and very low sticking coefficient within the groove. This combination leads to lateral spreading within the groove under the overhang.

Figure 3A:
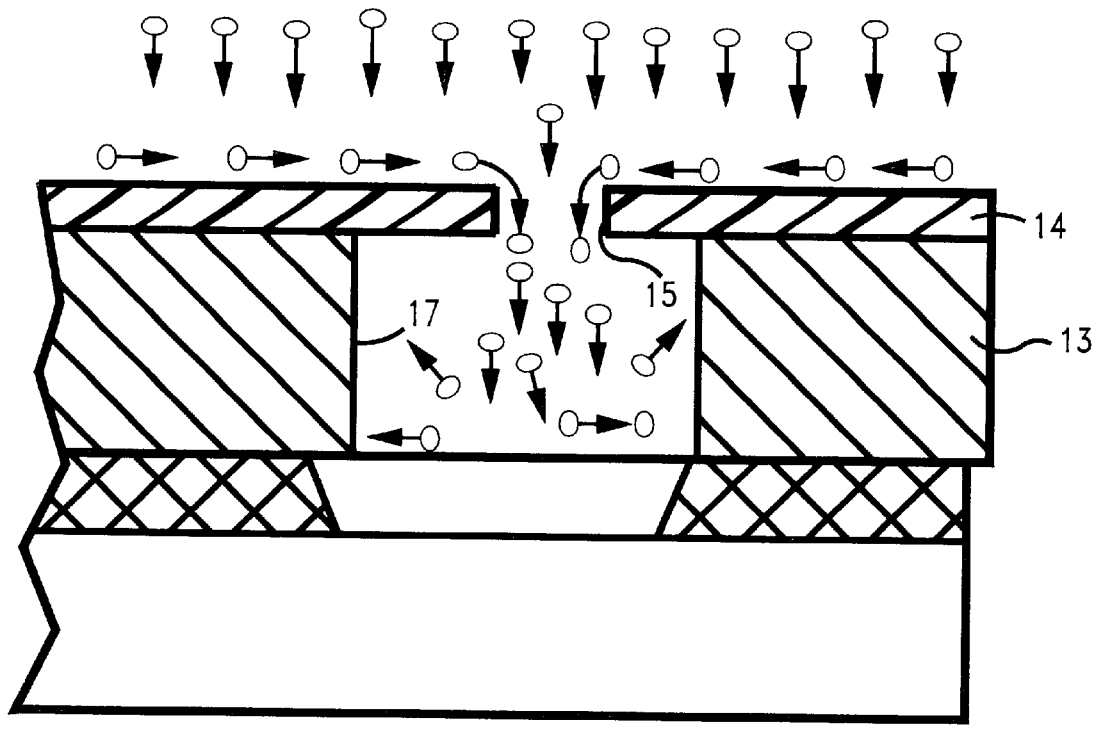
FIGS. 3a–3c schematically depict an atomic representation of a mechanism governing a lateral metal fill.
Figure 3B:
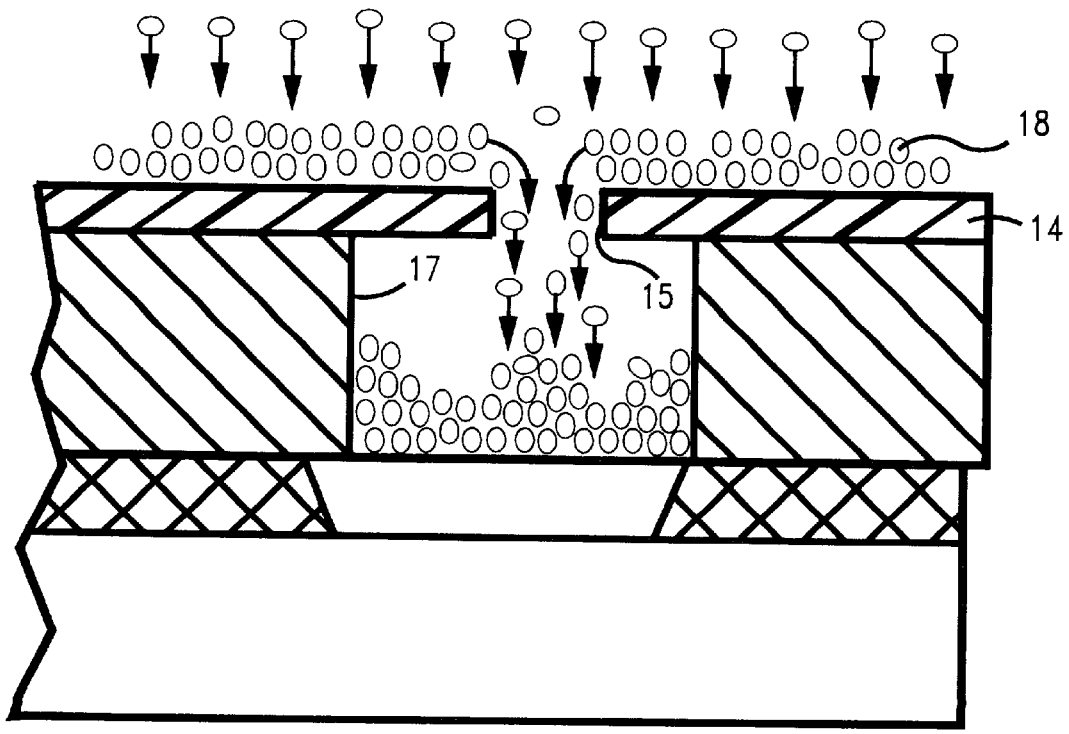
Figure 3C:
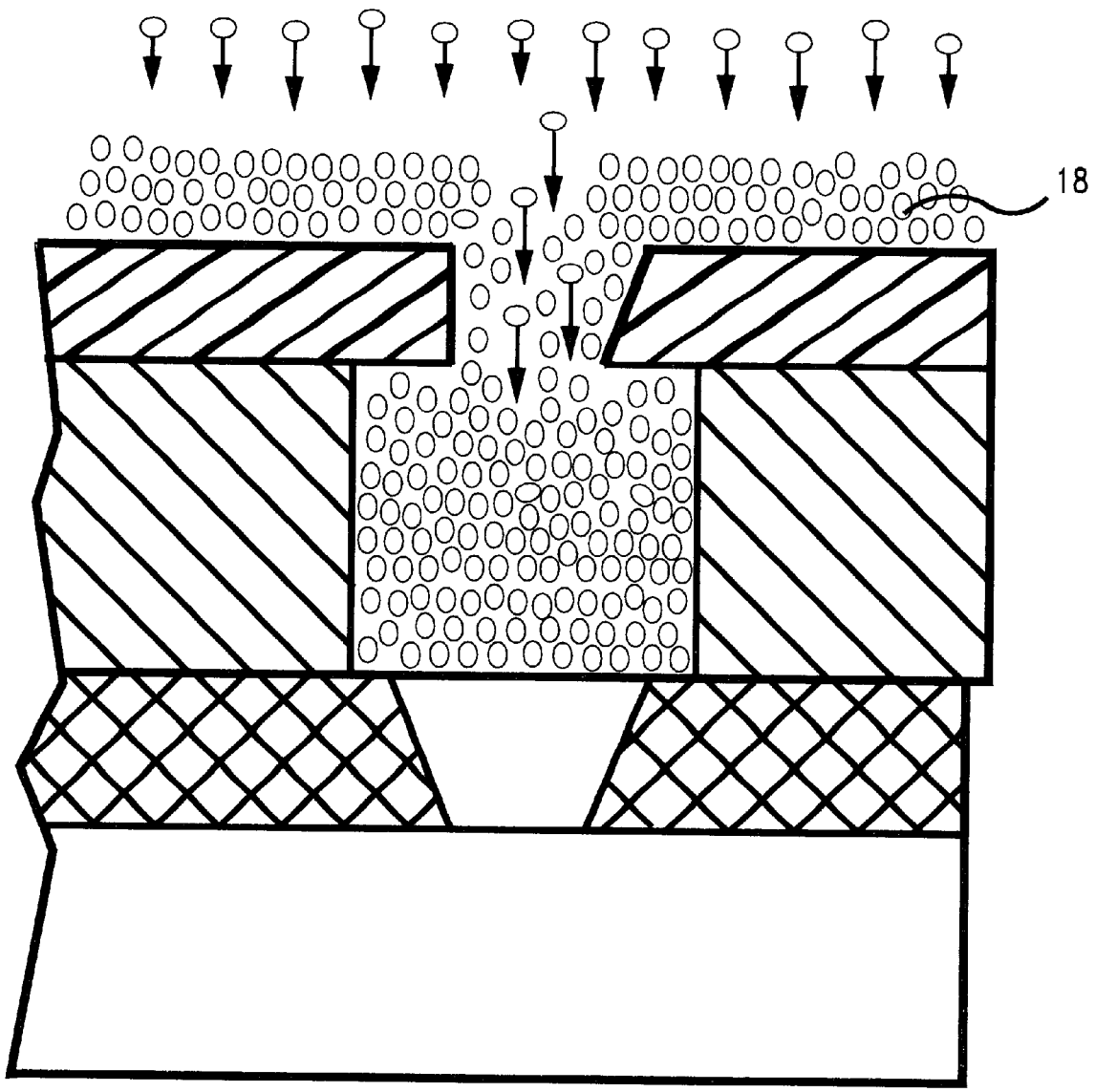

FIG. 3a shows the initial stage of metal deposition, wherein metal atoms arriving on the insulator layer 14 have high surface mobility, in the range of 0.05 to 0.3 $\mu$m., which cause these atoms to be swept into groove 17 through the slit opening 15. This atomic sweeping is brought about by high surface mobility, which is caused by: 1) high temperature, 2) a low scattering environment offered by the mixture of helium and argon, 3) a judicious choice of vitreous MgO or CVD (Chemical Vapor Deposition) $Al_2O_3$ for the insulator 14 to provide a low sticking coefficient, and 4) a low deposition rate due to a low total pressure and helium mixture.

Practitioners of the art will readily appreciate that this lateral spreading brought about by delayed and reduced nucleation of metal film atop the insulator 14, and increased surface mobility and scattering within the groove, is of fine magnitude in the order of 0.05 to 0.3 $\mu$m., and may advantageously be applied only wherever the metal line width and spacing geometries have sub-half-micron dimensions. Furthermore, metals with low sticking coefficient, such as Cu and Au, are particularly responsive to this method.

Figure 4A:
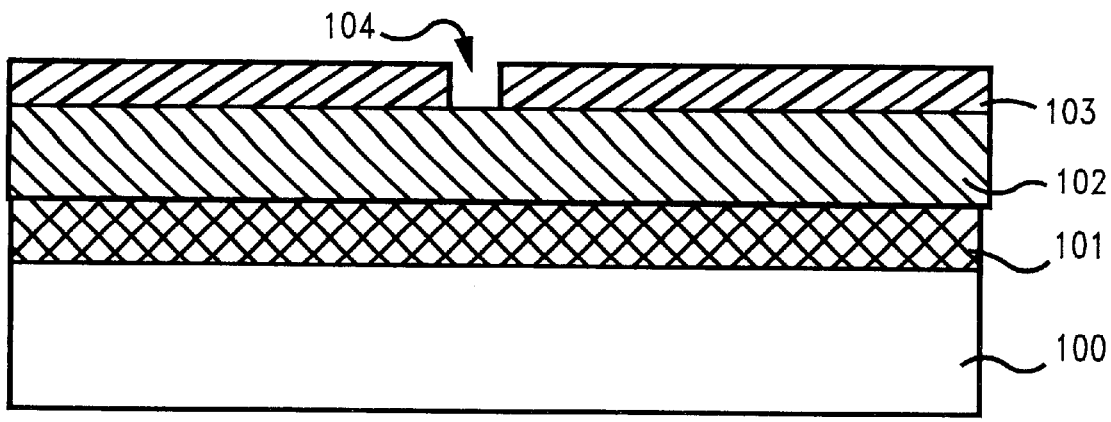
FIGS. 4a–4c are schematic diagrams depicting the phenomenon of metal micro-creep.
Figure 4B:
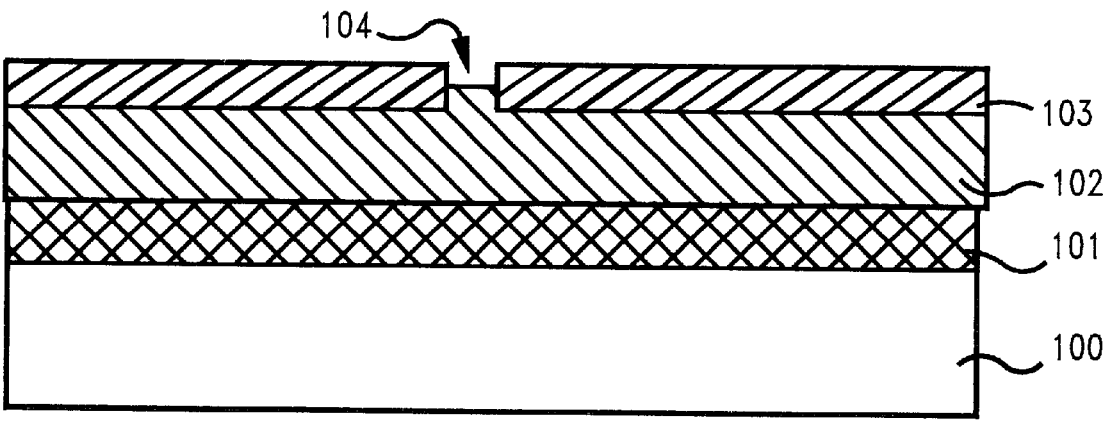

In a second embodiment of the present invention, filling the groove under an overhang is achieved by subjecting the metals to micro-creep. (Micro-creep is defined as an extrusion of metal through a crevice, of opening less than a few tenths of a micron, under a combination of compressive stress and high temperature.) This process is particularly well suited to metals having a relatively low melting point, e.g., less than 700° C., such as Al, Pb, In, Bi, Sn, or alloys thereof. The appropriate combination of process parameters, which is most advantageously used to achieve a certain level of extrusion, are interrelated, i.e., the higher the temperature, the lower the required compressive stress, and vice versa. This phenomenon is explained with reference to FIG. 4a, wherein the Al layer 102, having a thickness of 1 $\mu$m., is deposited on an oxide 101 coated substrate 100. An insulator layer 103 of $SiO_2$ is sputter-deposited to a thickness of 2$\mu$m; Openings 104 having a diameter less than 1 $\mu$m. is reactively ion-etched in the insulator layer 103 to open the surface of the Al. The surface of Al is then sputter cleaned. When the assembly is heated to a temperature of 400° C. or above, the Al extrudes into the etched hole, as illustrated in FIG. 4b.

Figure 4C:
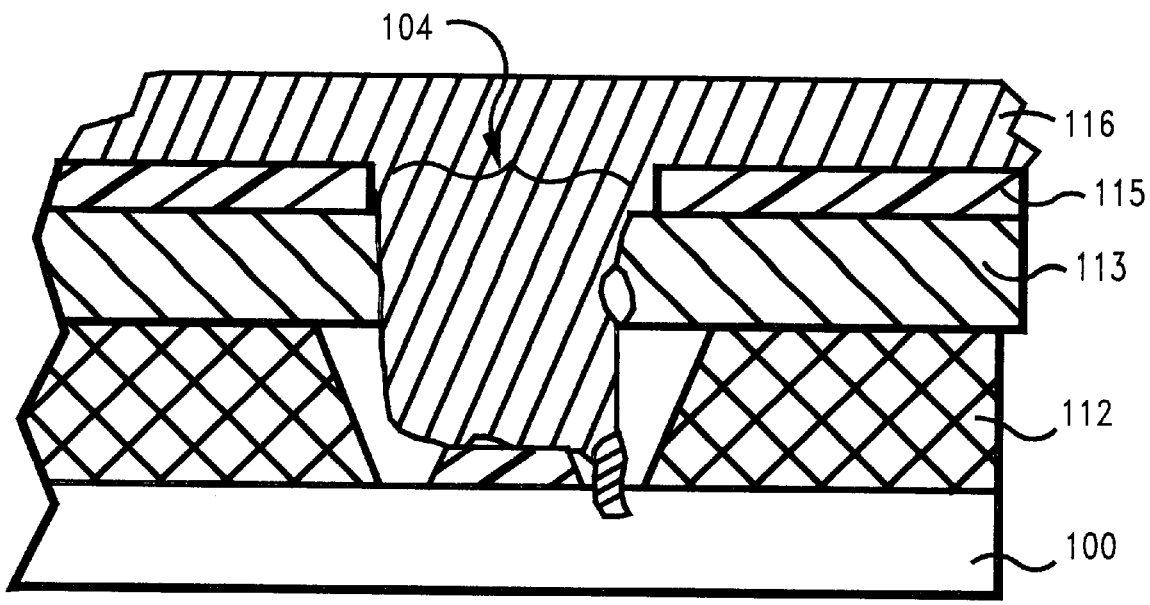

This phenomenon was first observed in semiconductor device contacts where the aluminum of an interconnect wiring extruded through narrow openings between the contact hole side-wall and the barrier metallurgy. This is depicted in FIG. 4c wherein a cross-section of an interconnecting wiring at a device contact, is shown on the silicon substrate 100. A contact hole 104 is defined in a composite insulator comprised of oxide 112 and nitride layers 113. A diffusion barrier metallurgy 115 of either Cr-$CrO_x$ or TiN is formed over a thin layer of Ti to form an ohmic or a Schottky diode (not shown). Al-4% Cu conductor metallurgy 116 is formed on top of the interlevel insulator 117. When this assembly is heated to a temperature of 400° C. or above to anneal defects out and to make a good ohmic contact, aluminum is observed to extrude and short-out the device, as shown in FIG. 4d. Again, the procedure described above to achieve an ultra-clean metal deposition environment must be adopted.

In all the aforementioned cases, the sputtered oxide layer atop the aluminum metallurgy is a source of compressive force; the higher the thickness of this insulator film (or the higher the compressive stress in the insulator film), the higher is the degree of aluminum extrusion, at any given temperature. Furthermore, since this is a diffusion phenomenon, the temperature required for micro-creep is at least three-quarter of the absolute melting point of the metallurgy used.

Figure 5A:
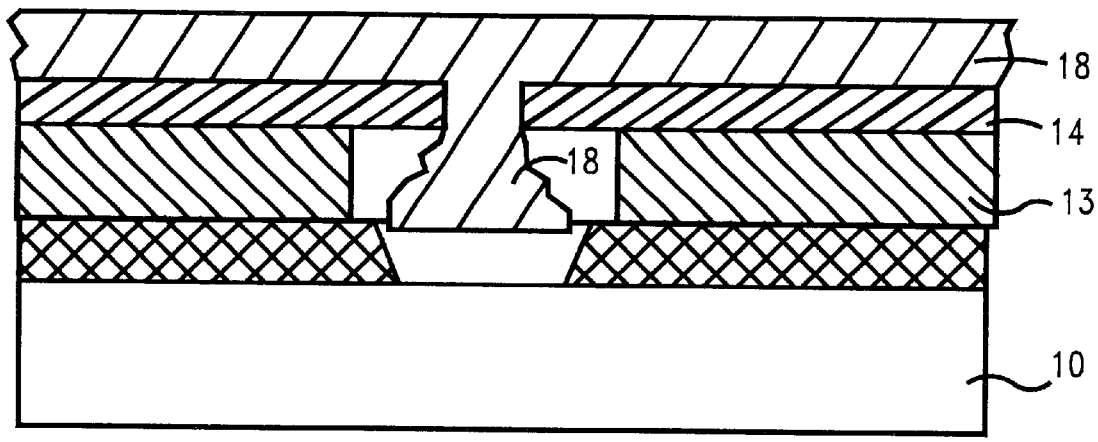
FIGS. 5a–5c illustrate an application of metal micro-creep to laterally fill the overhanged groove that defines an interconnection pattern.
Figure 5B:
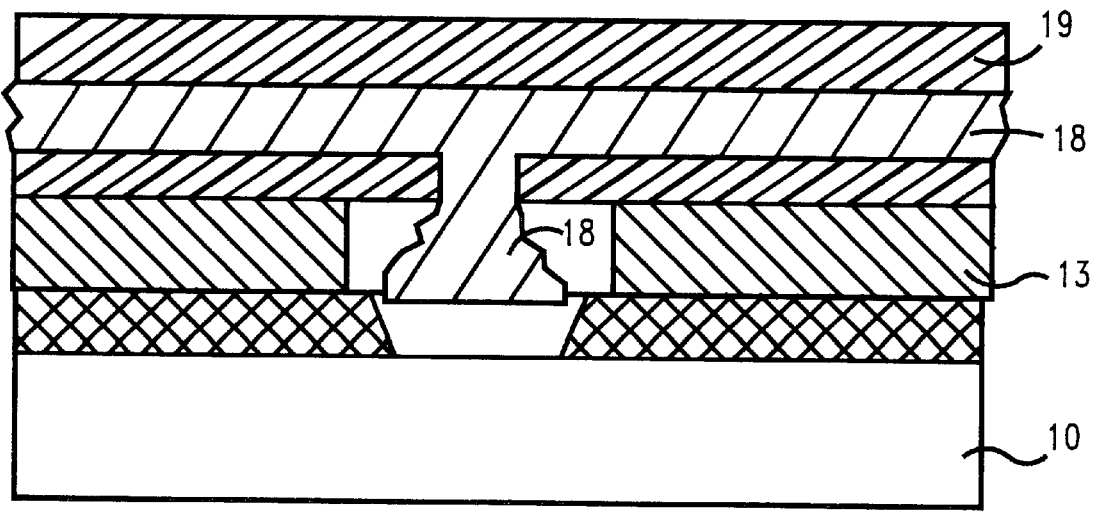
Figure 5C:
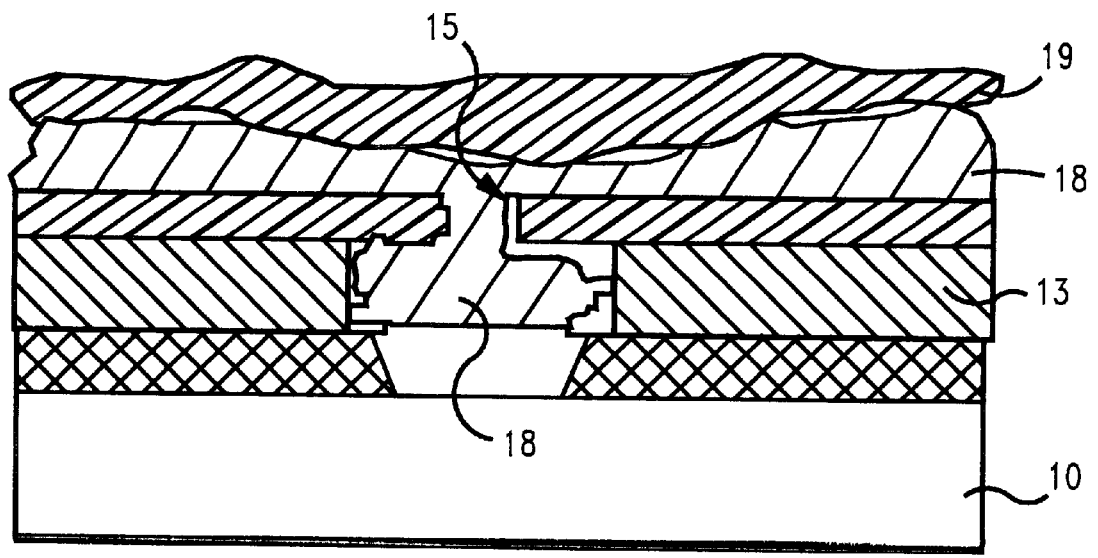

Referring now to FIGS. 5a–5c, the layer 18 of aluminum is deposited by sputtering or evaporation to a thickness 1.5 to 2 times the required thickness of metal wiring lines. The deposition temperature is not critical; nevertheless, room temperature is the most advantageous, since it provides a large number of grain boundaries (FIG. 5a). Again, utmost care must be taken to scrupulously remove all the residual reactive gases from the environment prior to metal deposition. As shown in FIG. 5a, the metal filling 18 into the overhanged groove is of poor quality. A layer 19 of high compressive stress material, (which is inert to the deposited-aluminum metal), is deposited to a thickness at least twice that of the metal, as shown in FIG. 5b. By way of example, sputtered silicon dioxide deposited at a temperature ranging between 400–500° C., or evaporated MgO, etc., are known to produce high compressive stress films. Wafers are next sintered at 450° C. for one hour to induce micro-creep in metal 18 (FIG. 5c) to fill in cavities left in the grooves. Only pure aluminum gets extruded by creep; however, at the time and temperature specified above, a diffusion of Cu, Si or both, (if used in the deposited layer 18), into aluminum take place rapidly, essentially resulting in an homogeneous alloy composition.

In a third embodiment of the present invention, lateral filling of groove 17 under the overhang 14 is obtained by taking advantage of a change in volume during the metallurgical phase change. Usually, a metal compound formation involves volume shrinkage when compared to the sum of the volume of the individual components of the compound; however, some alloy systems display an increase in volume upon formation of the compound. Since copper is one of the metals of choice in IC wiring because of its high conductivity, some of the alloy systems having copper as the main constituent and which display an increase in volume upon intermetallic compound formation are: copper-tin, copper-lanthanum, copper-ytterbium, copper-hafnium, and the like. The increase in volume is best achieved by depositing a layer (200 Å to 1000 Å) of one of these metals to be sandwiched between two copper layers, and heating the sandwich layer to a temperature ranging between 400–450° C. to bring about the diffusion that creates a higher volume intermetallic phase.

Figure 6A:
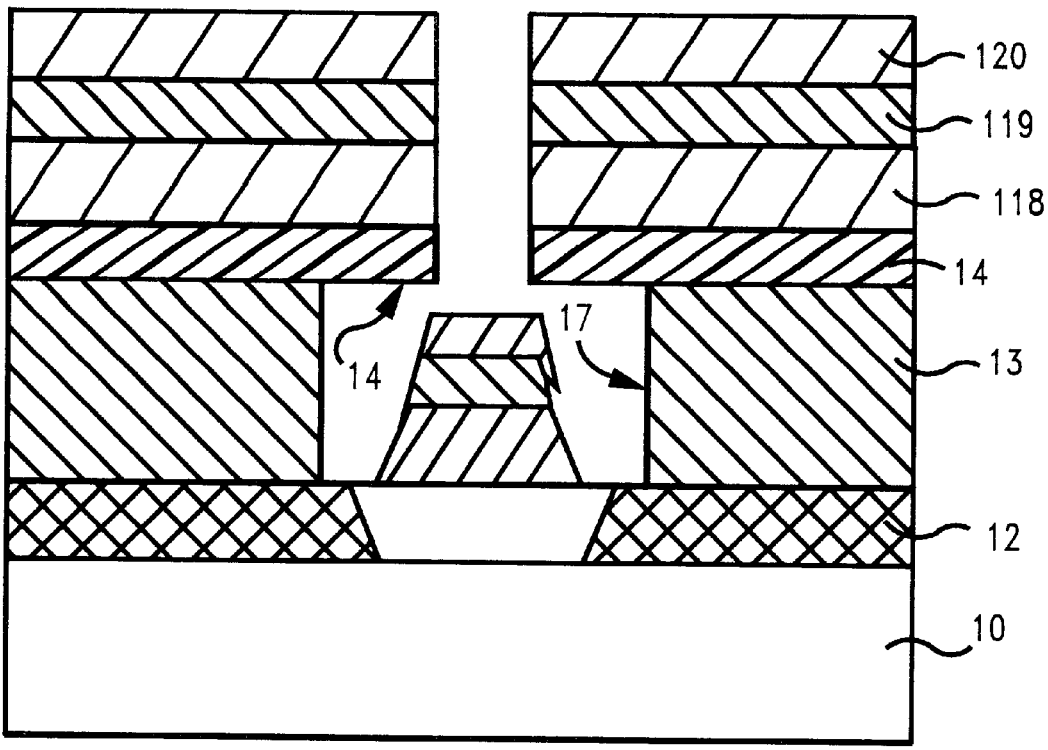
FIGS. 6a–6b illustrate a method of filling the overhanged groove by volume expansion caused by phase transformation.
Figure 6B:
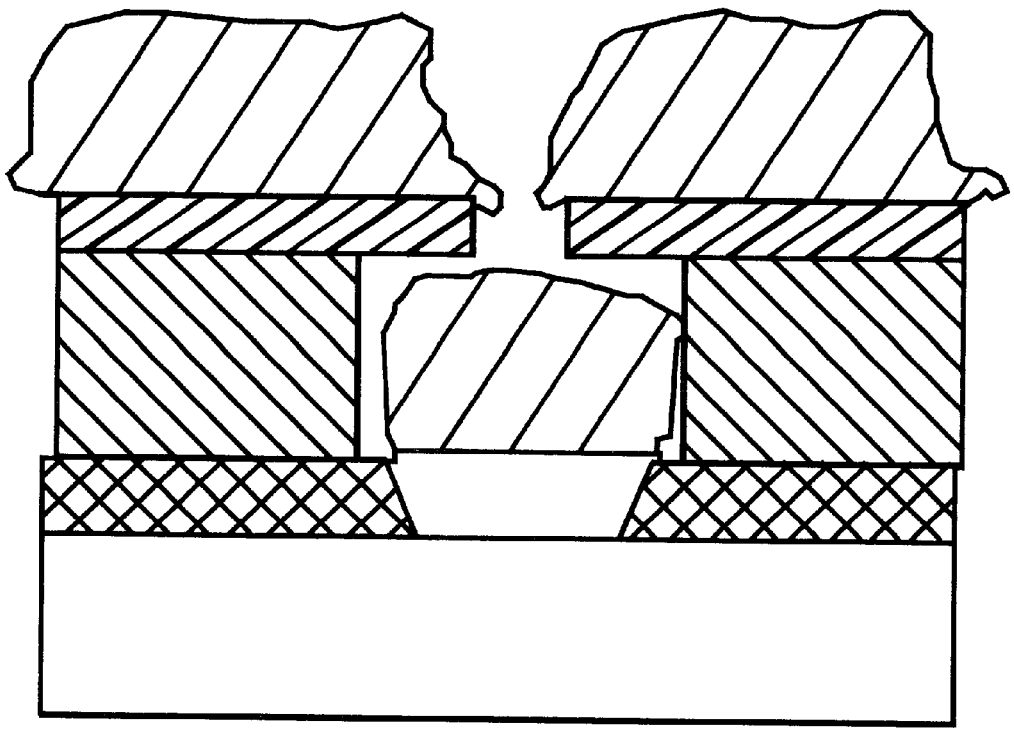

In accordance with this embodiment, starting with a wafer where the desired interconnection pattern is defined as a groove with the overhang structure of FIG. 1d, a copper layer 118 of half the desired thickness of the interconnection wiring is deposited by one of several known deposition techniques, preferably by low pressure sputtering. It is followed by deposition of 400Å to 1000 Å of Sn, La, Yb or Hf layer 119. Next, the remaining half of the copper thickness 120 is deposited, as shown in FIG. 6a. Wafers are then heated in an oxygen-free sintering furnace to a temperature of about 400–450° C. for 30 minutes to allow the sandwiched layer to react with copper, thereby forming the intermetallic compound. The volume increase associated with this compound formation fills the cavity in the groove, as shownlin FIG. 6b.

Any of the aforementioned embodiments and modifications thereof will result in the formation of sub-half micron wide wiring lines of Al, Cu or alloys thereof, leading to a high yield in a manufacturing environment. Furthermore, the high conductivity metal may essentially be encased on all four sides with refractory metal or with an alloy of choice. By providing methods of laterally depositing metals, problems associated with chem-mech polish of soft metals, or the increased resistance of the conductor section by use of a hard cap, or problems associated with dry etching are avoided.

While the invention has been disclosed with reference to embodiment of preferred methods of lateral metal deposition, it would be apparent to those skilled in the art that various changes to the process can be made without departing from the spirit and scope of the invention and the appended claims. For example, ECR (electron cyclotron resonance) with very high magnetic field could be used for lateral metal deposition.

Having thus described our invention, what is claimed as new and desired to secure by Letters Patent is as follows;

What is claimed is:

1. A method of laterally depositing metal into a trench positioned under an overhang, said trench being formed on a substrate of a semiconductor integrated circuit chip, the method comprising the steps of:
    depositing on said substrate a first insulating layer followed by a second insulating layer, said first and second insulating layers being of a different chemistry;
    defining an interconnect line pattern having a predetermined width;
    reactive ion-etching said second insulating layer;
    reactive ion-etching said first insulating layer at a pressure of at least 35 μm, followed by a wet chemical etch;
    forming an undercut equivalent to about one-third of said predetermined width at each edge of said trench;
    depositing on said substrate a conductive material layer with a thickness exceeding the depth of said trench, while maintaining said substrate at a temperature below 80° C., filling said trench with said conductive material leaving voids under said overhang;
    depositing a non-conductive layer on said conductive material layer while maintaining said substrate at approximately 400° C., said non-conductive layer placing said conductive material layer under compressive stress;
    heating for at least one hour said substrate in an inert atmosphere, at a temperature above 450° C.; and
    removing an excess of said conductive material outside of said trench, the combination of said heating and said compressive stress inducing said conductive material in said trench to micro-creep into said voids.

2. The method according to claim 1 wherein said conductive material layer is made of a metal selected from the group consisting of aluminum, copper and alloys thereof.

3. The method according to claim 1 wherein said non-conductive layer is selected from the group consisting of silicon dioxide, silicon nitride, magnesium oxide, aluminum oxide, diamond and any combination thereof.

4. The method according to claim 1 wherein said step of depositing said non-conductive layer is performed by sputtering at a temperature 400°–500° C.

5. The method according to claim 1 wherein said step of depositing said non-conductive layer is performed by evaporation.

6. The method according to claim 1 wherein said step of depositing said non-conductive layer is performed by plasma enhanced chemical vapor deposition (CVD).

7. The method according to claim 1 wherein said step of depositing said non-conductive layer is performed by electron cyclotron resonance (ECR).

8. The method according to claim 1, wherein said removing of said excess of conductive and non-conductive material is performed by chemical-mechanical polishing.

9. The method according to claim 1, wherein the thickness of said conductive material layer is approximately 1 micrometer.

10. The method according to claim 1, wherein the thickness of said non-conductive layer is approximately 3 micrometers.

11. The method according to claim 1, wherein said inert atmosphere consists of nitrogen.

* * * * *